US008043890B2

(12) United States Patent
Coenen et al.

(10) Patent No.: US 8,043,890 B2

(45) Date of Patent: Oct. 25, 2011

(54) PROCESS FOR SEPARATING DISK-SHAPED SUBSTRATES WITH THE USE OF ADHESIVE POWERS

(76) Inventors: Wolfgang Coenen, Grasberg (DE); Nils Hendrik Coenen, Bremen (DE)

( * ) Notice: Subject to any disclaimer, the term of this patent is extended or adjusted under 35 U.S.C. 154(b) by 770 days.

(21) Appl. No.: 12/092,618

(22) PCT Filed: Nov. 8, 2006

(86) PCT No.: PCT/EP2006/068253

§ 371 (c)(1),
(2), (4) Date: May 5, 2008

(87) PCT Pub. No.: WO2007/054525

PCT Pub. Date: May 18, 2007

(65) Prior Publication Data

US 2008/0286947 A1 Nov. 20, 2008

(30) Foreign Application Priority Data

Nov. 9, 2005 (DE) ........................ 10 2005 053 410
May 9, 2006 (DE) ........................ 10 2006 021 647

(51) Int. Cl.
*H01L 21/44* (2006.01)
*H01L 21/48* (2006.01)
*H01L 21/50* (2006.01)

(52) U.S. Cl. . 438/106; 438/118; 438/311; 257/E21.014; 257/E21.114; 257/E21.205; 257/E21.212; 257/E21.32; 257/E21.499

(58) Field of Classification Search .................. 438/106, 438/118, 311, 475, 513; 257/E21.014, 114, 257/205, 212, 32, 499
See application file for complete search history.

(56) References Cited

U.S. PATENT DOCUMENTS 5,575,868 A * 11/1996 Mann ............................ 156/64
6,478,069 B1 * 11/2002 Fujisaku et al. .............. 156/584
6,821,376 B1 * 11/2004 Rayssac et al. ............... 156/344
7,520,954 B2 * 4/2009 Kratzer et al. ................ 156/344

FOREIGN PATENT DOCUMENTS

DE 195 81 457 A 4/1999
DE 199 50 068 A1 4/2001
DE 103 59 732 A1 7/2005
JP 55 096267 A 7/1980
JP 61 125767 6/1986

* cited by examiner

*Primary Examiner* — David Nhu

(74) *Attorney, Agent, or Firm* — McGlew and Tuttle, P.C.

(57) ABSTRACT

The present invention relates to a device and a method for dividing up substrates (2) in wafer form (e.g. wafers), which is used in the semiconductor industry, MST (microstructure technology) industry and photovoltaic industry, whereby improved reliability of the process and lower reject rates are accomplished. This object is achieved according to the invention by using adhesion forces that act between the substrates in wafer form and the devices (1) thereby used.

14 Claims, 3 Drawing Sheets

PROCESS FOR SEPARATING DISK-SHAPED SUBSTRATES WITH THE USE OF ADHESIVE POWERS

CROSS REFERENCE TO RELATED APPLICATIONS

This application is a United States National Phase application of International Application PCT/EP06/68253 filed Nov. 8, 2006 and claims the benefit of priority under 35 U.S.C. §119 of German Patent Application DE 10 2005 053 041.4 filed Nov. 9, 2005 and German Patent Application DE 10 2006 021 647.4 filed May 9, 2006, the entire contents of which are incorporated herein by reference.

FIELD OF THE INVENTION

The present invention pertains to a device and a process for separating disk-shaped substrates, especially wafers.

BACKGROUND OF THE INVENTION

Disk-shaped substrates (for example, so-called wafers) from semiconductor material, which are manufactured, among other things, from polycrystalline and monocrystalline silicon, are needed for the semiconductor, MST (microstructure technology) and photovoltaic industries for manufacturing products of these branches of industry.

To obtain these disk-shaped substrates, blocks or cylinders of these semiconductor materials are cut into disk-shaped substrates by means of wire saws. This is carried out by a cutting process, during which this wire (thickness 200 μm) is pulled in a plurality of windings in parallel through the block or cylinder by means of an abrasive, which is in a so-called slurry. Wafer thicknesses of 270 μm to 320 μm are thus obtained currently. The blocks or cylinders cut into wafers are cleaned after this cutting in a cleaning step to remove the slurry. Since the need for high-purity silicon has increased greatly worldwide, because the manufacturers of wafers are currently unable to deliver sufficient quantities of wafers for the photovoltaic industry, it is necessary that the wafer thicknesses be reduced, especially for this field of application, in order to obtain a larger number of wafers from one block or cylinder. Wafer thicknesses of less than 130 μm are desirable. The separation of such disk-shaped substrates is currently embodied by mechanical gripping or pushing mechanisms, which act on the edges of the wafer and thus lead to an increased percentage of broken wafers. Such a process is described in European Patent EP 0 802 028 A2. The individual wafers are cut off there and brought to the receiving device by means of a conveyor belt.

Another method of separating wafers is described in German Patent DE 199 00 671 A1. The individual wafers are separated from each other in this process by blowing in fluid streams. This kind of separation might be suitable for wafers of standard thicknesses.

The small thicknesses of less than 130 ρm make the wafers, which are already highly susceptible to breakage, even more sensitive to mechanical loads, so that wafer separation processes, which apply compressive, tensile or shearing forces on the wafers, must be avoided as much as possible. This also forbids separation by hand, because this handling also leads to great losses of wafers due to breakage and leads, moreover, to a greatly reduced reproducibility.

It is therefore necessary because of the highly complicated and sensitive handling to automate separation processes as much as possible.

SUMMARY OF THE INVENTION

To solve the problem described above, the process of separating disk-shaped substrates according to the adhesion method is proposed.

Since the process according to the present invention has a carrier element, which has a surface that is designed to form an adhesive power between the surface and a disk-shaped substrate adjoining the surface of the carrier element for pulling off the disk-shaped substrate from a stack of disk-shaped substrates, even a very thin substrate can be pulled off without being damaged and yet in a reliable manner. The adhesive power between the surface of the carrier element and the substrate acts essentially over the entire surface, so that there is no risk of damage or impairment of the quality of the substrate due to the separation here. In the process according to the present invention, a power is generated between the surface of the carrier element and a disk-shaped substrate adjoining same by means of adhesion and the disk-shaped substrate is then pulled off from a stack of disk-shaped substrates by means of this adhesive power. As a result, a homogeneous distribution of powers is generated on the substrate, with which the substrate can be pulled off reliably, on the one hand, and, on the other hand, damage is reliably prevented from occurring.

In one embodiment of the present invention, the carrier element has a layer consisting of a plastic material to form the surface. For example, a layer of a glass fiber-reinforced polyethylene film is suitable for use as such a plastic material. However, it is also possible that the plastic material has a layer consisting of polymethyl methacrylate (PMMA). Good adhesive powers can be attained with such plastics. In addition, the surface of the carrier element may be hydrophilic. A water film, with which good adhesive powers can be attained, can be applied to the surface in this case. In addition, it is advantageous if the surface of the carrier element is enlarged. For example, the surface of the carrier element may be roughened. Especially good results can be obtained if the surface of the carrier element is finely structured. Good and uniform adhesive powers can be formed between the surface and the substrate by means of a surface enlarged in this manner, in which, for example, water can then be incorporated in a hydrophilic embodiment, so that especially good results can be obtained.

In another embodiment of the present invention, a retaining device is provided to retain the disk-shaped substrates of the stack, which are not pulled off. Since adhesive powers can also act between the substrates, it shall be ensured that only the topmost substrate of the stack is pulled off from the stack by means of the carrier element and that the other substrates of the stack will remain in the stack. The retaining device may have, for example, one or more flexible stripping edges. As a result, reliable retention of the remaining substrates of the stack can be brought about with a simple design.

In another embodiment of the present invention, separating means are provided for separating the carrier element from the disk-shaped substrate adhering thereto. These separating means make it possible to abolish the adhesive powers for depositing the substrate in a defined manner at a desired position. It is possible, for example, that the separating means has a duct for guiding a fluid between the carrier element and the substrate. However, the separating means may also have a basin filled with a liquid. The substrate is dipped into the liquid in this case, so that the water film between the substrate and the carrier element becomes thicker due to capillary action until the substrate separates from the carrier element. This separation can be supported by a jerky stripping motion in the liquid.

In addition, it is advantageous if a support is provided for the separated substrates. The support may be a conveyor belt, a support rack or a mounting frame. The separated substrates can be deposited and subjected to further processing in a specific manner in this case.

If a robot arm is provided in a variant of the present invention for actuating the carrier element, the separation can be reliably automated in a simple manner.

In another embodiment, a sensor is provided for recognizing a damaged substrate. The substrates can be separated and damaged substrates sorted out in this manner in one operation in the automated process.

To separate the disk-shaped substrates—independently from their thickness—the following consideration was used as the starting point:

The effect that intermolecular forces in the boundary layer area play a role between very smooth surfaces is utilized. Example: Two highly polished, perfectly flat surfaces (metal-metal or glass-glass) can only be displaced in relation to one another, but they cannot be lifted off from one another. This is due, among other things, to the adhesive powers (van-der-Waal's bonds or hydrogen bridge bonds), which act in such processes.

The same effect is also seen during the interaction of smooth surfaces, which a disk-shaped substrate, for example, a silicon wafer, with a smooth surface, has with other materials.

It may be necessary for this that a liquid film be present between the two surfaces. The two surfaces can be displaced on one another on this liquid film and they nevertheless continue to adhere to one another. The term "adhesive power" is used in the present invention synonymously for these powers.

However, the material suitable for this with the surface properties necessary herefor must be selected for the carrier element of the wafer separation system. A good result can be obtained with plastics that have a finely structured surface.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
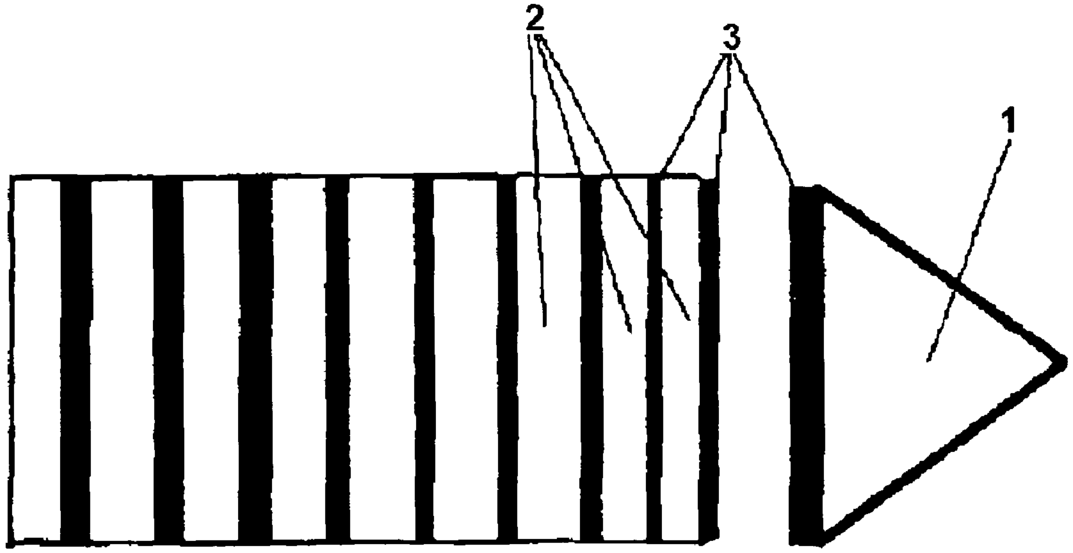
FIG. 1 is a side view showing cut-away disk-shaped substrates (2) with the liquid (3) adhering between them.

Referring to the drawings in particular, the disk-shaped substrates (2), which adhere to each other in an already cut and cleaned block or cylinder (FIG. 1), shall be separated from one another as wet disk-shaped substrates and deposited one by one.

Figure 2:
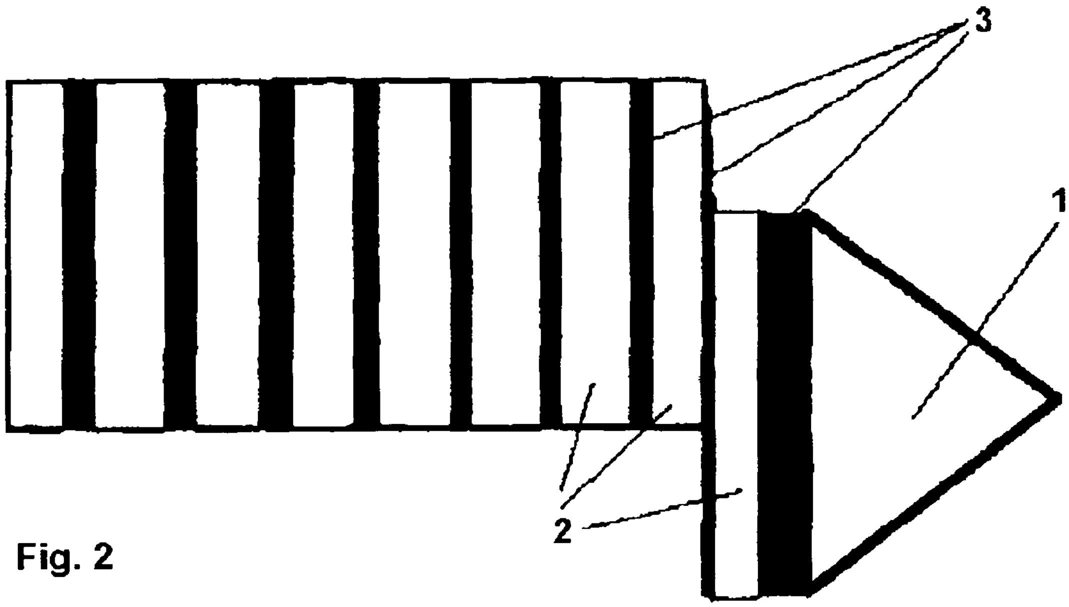
FIG. 2 is a side view showing a first step for separating the disk-shaped substrates (2): The carrier element (1) is placed on the disk-shaped substrate (2) and the disk-shaped substrate (2) is pushed off from the stack of disk-shaped substrates (2)

To do so, the first disk-shaped substrate (2), which is wetted with the liquid (3), is pulled off from the stack of disk-shaped substrates with the carrier element having the finely structured surface (1), to which the liquid (3) likewise adheres. (FIG. 2)

Figure 3:
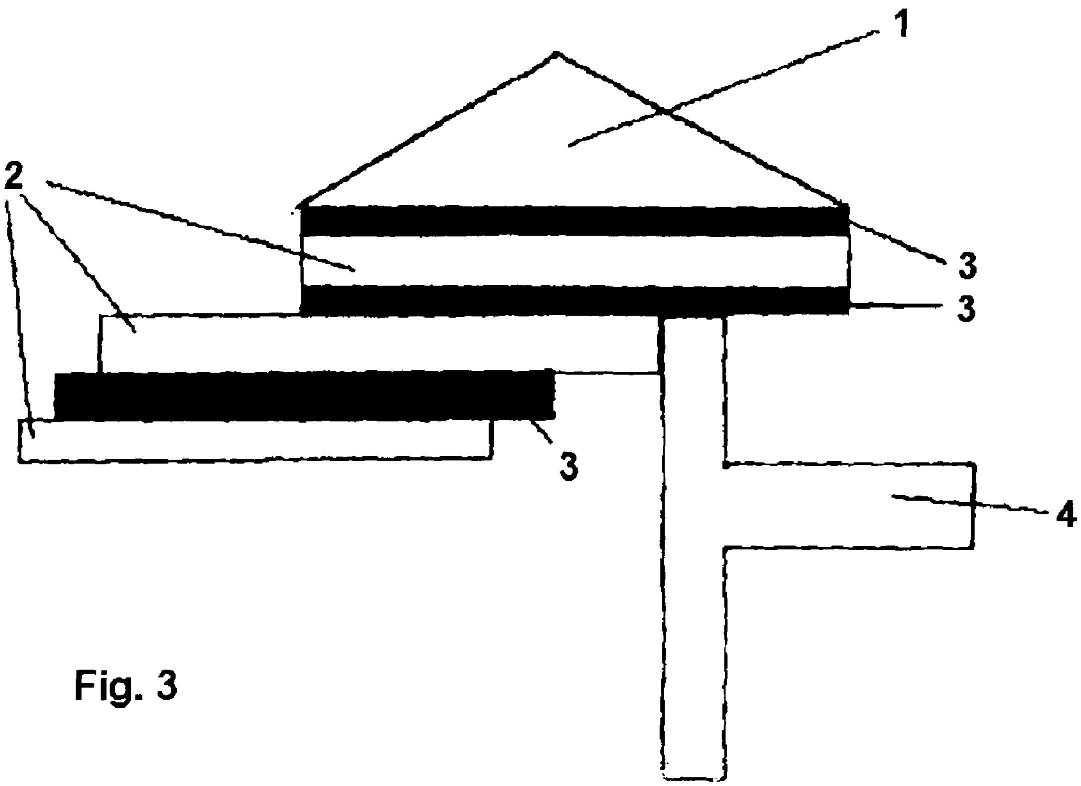
FIG. 3 is a side view showing a second step for separating the disk-shaped substrates (2): Stripping off of the disk-shaped substrate (2) at the retaining device (4)

Additional disk-shaped substrates (2), which must be retained, are also pulled along, as a rule, by the adhesive powers, which also act here, due to the intermolecular forces in the boundary layer area, which were already mentioned, and which also act, of course, between the individual disk-shaped substrates (2) because a liquid film is likewise present between the individual disk-shaped substrates. (FIG. 3)

A retaining device (4), which retains the disk-shaped substrate or substrates (2), which is/are pulled along during the pulling off of the first disk-shaped substrate (2), is used for this on the side of the stack of disk-shaped substrates at the level of the first disk-shaped substrate (2).

The retaining device (4) consists of a material which has sufficiently strong adhesive powers in relation to the disk-shaped substrates (2) to be separated and whose shape guarantees reliable separation of the disk-shaped substrates (2). This retaining device may also be designed as a stationary stripping edge.

It is ensured by selecting suitable materials that the adhesive powers, which act between the individual disk-shaped substrates (2), are overcome by the stronger adhesive powers, which act between the retaining device (4) and the disk-shaped substrate (2) following it. These powers are, in turn, weaker than the adhesive powers, which act between the first disk-shaped substrate (2) and the carrier element with the finely structured surface (1), so that each disk-shaped substrate (2) can be pulled off individually.

The retaining device (4) consequently has a sufficiently strong adhesive power to retain the disk-shaped substrate(s) (2) being pulled along, i.e., the adhesive power that is exerted by the retaining device (4) on the second and following disk-shaped substrates (2) is stronger than the adhesive power that allows the first and following disk-shaped substrates (2) to adhere to one another. If a stationary stripping edge is used as the retaining device (4), the topmost disk-shaped substrate (2) pushes the disk-shaped substrate (2) following it against this edge and is retained.

After the first disk-shaped substrate (2) has stuck to the carrier element (1), it is transported, adhering to the carrier element (1), to where it is to be deposited.

Figure 4:
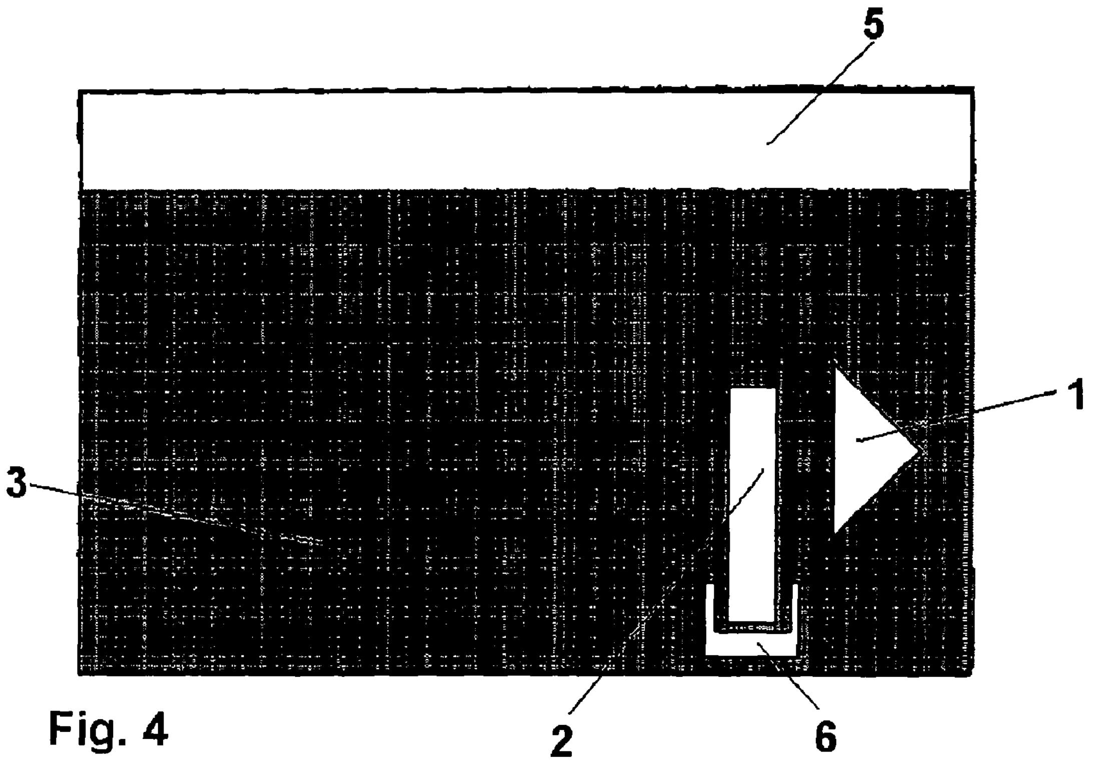
FIG. 4 is a view showing a last step according to the first embodiment of the invention: Deposition of the disk-shaped substrate (2) in the support device (6); the disk-shaped substrate (2) is completely immersed in the liquid (3) and separated from the carrier element (1)
Figure 5:
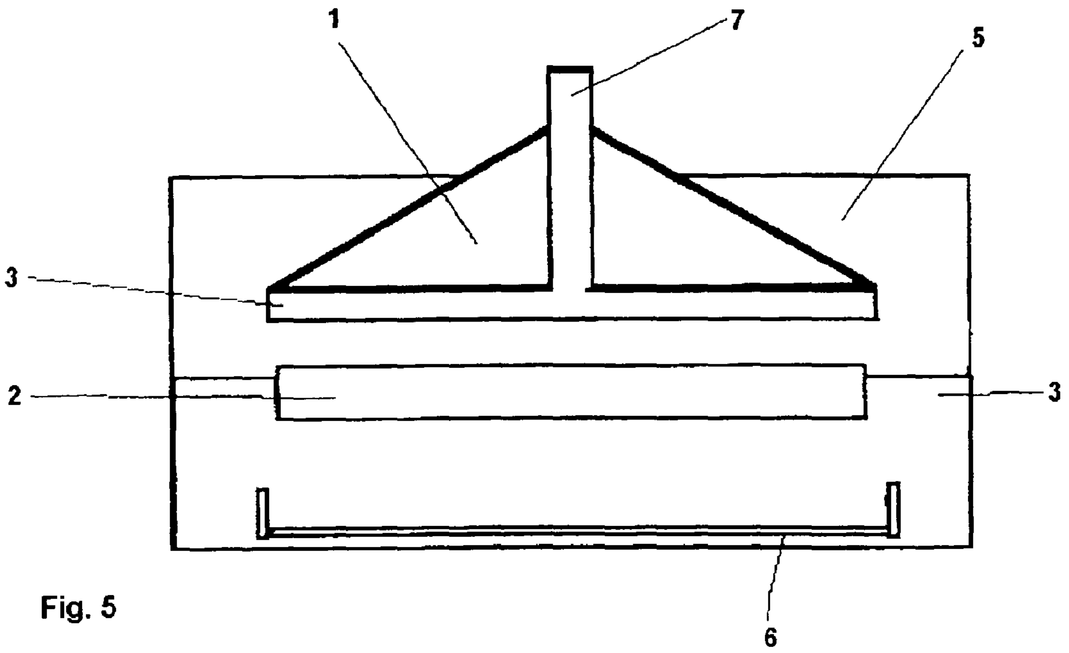
FIG. 5 is a side view showing a last step according to the second embodiment of the invention: The disk-shaped substrate (2) adhering to the carrier element with finely structured surface (1) is underwashed with liquid (3) and deposited in a suitable device.

This site (e.g., support rack or mounting frame (6)), is completely in a liquid (3), which is located in a basin (5). (FIG. 4)

To deposit the individual disk-shaped substrates (2) in a support device, it is necessary to reduce the adhesive powers, which cause the disk-shaped substrate to adhere to the carrier element with finely structured surface (1). To ensure that the disk-shaped substrate will separate from the carrier element with finely structured surface (1), it is necessary for the thickness of the liquid film (3) to be increased. This is brought about either by filling the liquid through a hole (7) in the carrier element with the finely structured surface (1) into the area between the surface of the disk-shaped substrate (2) and the finely structured surface of the carrier element (1) or by dipping the carrier element with the finely structured surface (1) into the liquid (3). The thickness of the liquid film (2) is increased in this case due to the beginning capillary action and the adhesive powers are thus abolished.

The adhesive powers are abolished in both cases and further adhesion is prevented. The disk-shaped substrate (2) can thus be placed in the support device (6) intended therefor and extremely accurately.

The other disk-shaped substrates (2) are also separated in the same manner.

It is essential in this process for separating disk-shaped substrates (2) according to the adhesion method that only extremely weak mechanical loads act on the disk-shaped substrates (2) in this process and the disk-shaped substrates are not loaded with powers that can act such that the disk-shaped substrates would be damaged, because the risk of rupture of the disk-shaped substrates (2) is further reduced by the reduction of the mechanical loads by means of the process being proposed.

In addition, it is important in this process that it offers the possibility of separating complete disk-shaped substrates (2) from damaged disk-shaped substrates (2) due to the fact that they can be brought, adhering to the carrier element (1), to different sites after the completeness or defectiveness of the individual disk-shaped substrate (2) has been determined by sensors, because it can definitely happen that individual, already cut disk-shaped substrates (2) are damaged by the sawing process and thus become unfit for use for the end product.

This process offers an additional advantage concerning the time required for the separation of the disk-shaped substrates (2). The separation of the individual disk-shaped substrates (2) from the stack of disk-shaped substrates can be carried out in a relatively short time. The time required amounts to about 2-3 sec from the time the carrier element (1) is attached to the separation of the topmost disk-shaped substrate (2) from the stack of disk-shaped substrates (this applies to disk-shaped substrates (2) with a size of 140 mm×140 mm). This time may vary because the size of the disk-shaped substrates (2) affects the time period needed for the separation.

Thus, increased yield of complete disk-shaped substrates per cut block or cylinder is achieved by the process for separating disk-shaped substrates according to the adhesion method and economy is substantially improved.

Figure 6:
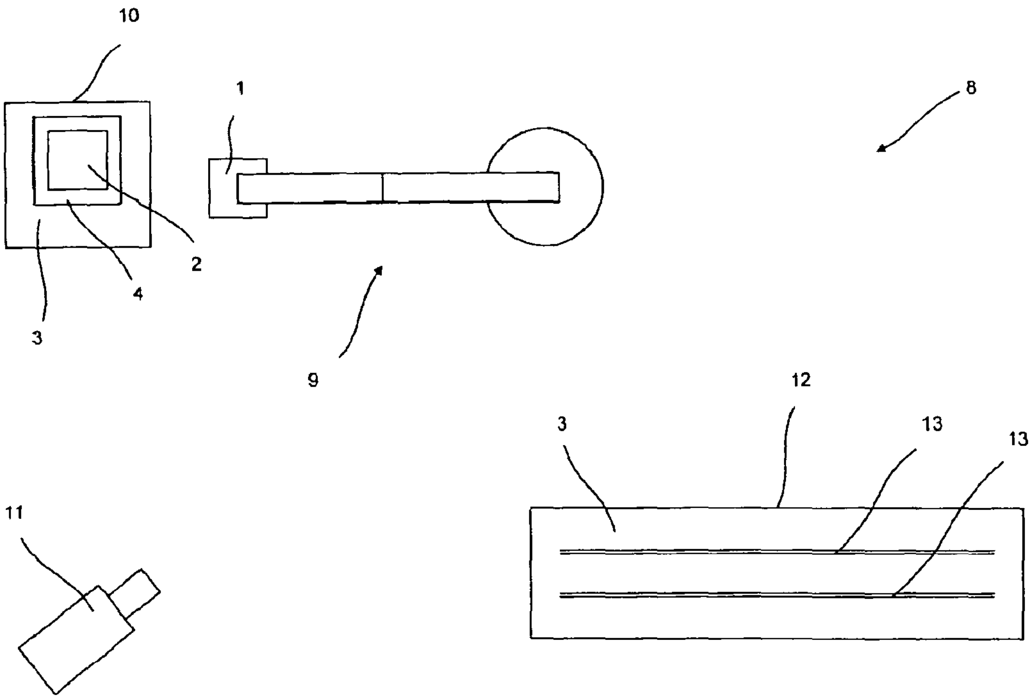
FIG. 6 is a top view of a device for separating disk-shaped substrates.

FIG. 6 shows a separating device with the features of the present invention. Identical elements are designated by the same reference numbers as in the preceding figures. As can be determined from the figure, the carrier element 1 is arranged pivotably at the end of a robot arm 9. A substrate 2 can be lifted off from a stack by building up an adhesive power between the carrier element 1 and the substrate 2 by means of the carrier element 1 in the manner already described above. The stack of substrates 2 is arranged in the exemplary embodiment being shown in a retaining device 4, which is located in a basin 10. A liquid 3 is contained in the basin 10. After pulling off a substrate 2 from the stack with the carrier element 1, the robot arm 9 pivots about its axis such that the substrate 2 is caused to face a sensor, an optical image recorder 11 in the example being shown here. The quality and especially the presence of damages on the substrate 2 is checked by means of the optical image recorder 11. If damage is detected, the substrate is sorted out by being deposited in a position not shown in the figure. If good quality and especially absence of damage is determined by the optical image recorder 11, the substrate 2 is deposited as the next substrate in a basin 12 filled with liquid 3 on conveyor belts 13. This deposition takes place as was already explained above. After deposition on the conveyor belts 13, the respective substrate 2 is moved to a position not shown in the figure for further processing. However, it is also possible to arrange a carrier with a plurality of individual supports for one substrate 2 each adjacent to a carrier.

It may be useful in practice for the robot arm 9 to perform only a linear motion instead of a pivoting motion. A suitable support, for example, the conveyor belt 13 arranged in the basin 12, would now be arranged in the direction of the robot arm 9 in front of or behind the stack. The robot arm 9 picks up such a substrate in this case only by pulling off a substrate 2 from the stack and then deposits same right away on the conveyor belts 13. The sensor 11 for checking the absence of damage to the wafer 2 would now be arranged, for example, above the conveyor belts 13. A higher speed of separation can be achieved with this design because the robot arm 9 performs the separation only and the checking of the quality of the wafers can subsequently take place on the conveyor belts 13 with subsequent sorting out, while the robot arm 9 is already pulling the next substrate 2 from the stack.

While specific embodiments of the invention have been shown and described in detail to illustrate the application of the principles of the invention, it will be understood that the invention may be embodied otherwise without departing from such principles.

The invention claimed is:

1. A process for separating disk-shaped substrates, especially wafers, the process comprising:

providing a device for separating disk-shaped substrates, especially wafers, the device comprising a carrier element having a carrier element surface, said carrier element surface forming an adhesive force means when a disk-shaped structure is in contact with said carrier element surface such that said carrier element removes said disk-shaped substrate from a stack of disk-shaped substrates;

generating said adhesive force between the carrier element surface of the carrier element and a disk-shaped substrate; and removing at least one of said disk-shaped substrates from a stack of disk-shaped substrates via said adhesive force generated between said carrier element surface and said at least one of said disk-shaped substrates.

2. A process in accordance with claim 1, wherein said stack of disk-shaped substrates is located in an emulsion, a liquid or a gas.

3. A process in accordance with claim 1, wherein said disk-shaped substrates are removed from the stack one by one via said adhesive force, each disk-shaped substrate being deposited in a controlled manner.

4. A process in accordance with claim 1, further comprising a retaining device, said retaining device retaining at least one of the disk-shaped substrates of the stack when one of said disk-shaped substrates is removed from the stack.

5. A process in accordance with claim 1, wherein the generation of the adhesive force is enhanced by means of a fine structuring of the carrier element surface of the carrier element.

6. A process in accordance with claim 1, wherein said adhesive force is generated by a liquid film located between the carrier element surface of the carrier element and the disk-shaped substrate.

7. A process in accordance with claim 4, wherein said retaining device is composed of a material having a retaining adhesive force such that said retaining adhesive force retains said stack of disk-shaped substrates when one of said disk-shaped substrates is removed from said stack.

8. A process in accordance with claim 5, wherein the disk-shaped substrate to be separated is in contact with the carrier element surface of said carrier element.

9. A process in accordance with claim 4, wherein the disk-shaped substrate adhering to the carrier element via said adhesive force is separated from the stack of disk-shaped substrates by engaging said retaining device such that said retaining device retains said stack of disk-shaped substrates, whereby said disk-shaped substrate adhering to said carrier element is separated from said stack of disk-shaped substrates.

10. A process in accordance with claim 4, wherein at least one of the disk-shaped substrates in said stack engages said retaining device when said disk-shaped substrate adhered to said carrier element surface is removed from said stack.

11. A process in accordance with claim 6, wherein said disk-shaped substrate adhering to the carrier element surface is separated from the carrier element in a controlled manner by introducing liquid in an area between a surface of said disk-shaped substrate and said carrier element surface such that a thickness of the liquid film located between a surface of the disk-shaped substrate and said carrier element surface of the carrier element is increased or said substrate adhering to said carrier element surface by dipping the carrier element with the disk-shaped substrate connected thereto into liquid.

12. A process in accordance with claim 1, wherein the disk-shaped substrate is deposited in a basin, said basin being filled with liquid, wherein a support device is located in said basin.

13. A process in accordance with claim 1, wherein the disk-shaped substrate adhering to the carrier element is positioned such that said disk-shaped substrate faces a sensor, said sensor determining whether the disk-shaped substrate has been damaged.

14. A process for separating disk-shaped substrates, the process comprising:

providing a stack of disk-shaped substrates, said stack of disk-shaped substrates being located in an emulsion, a liquid or a gas phase;

providing a device for separating disk-shaped substrates, the device comprising a carrier element having a carrier element surface, said carrier element surface forming an adhesive force means when a disk-shaped structure is in contact with said carrier element surface;

contacting one of said disk-shaped substrates with said carrier element such that an adhesive force is generated between a surface of said one of said disk-shaped substrates and said carrier element surface;

moving said carrier element with said one of said disk-shaped substrates connected thereto such that a pulling force is exerted on said one of said disk-shaped substrates, whereby said one of said disk-shaped substrates is removed from said stack of disk-shaped substrates via said pulling force and said adhesive force.

* * * * *